United States Patent
Fukuda et al.

(10) Patent No.: US 6,439,154 B2
(45) Date of Patent: *Aug. 27, 2002

(54) PLASMA PROCESSING APPARATUS FOR SEMICONDUCTORS

(75) Inventors: Hideaki Fukuda; Baiei Kono, both of Tama (JP)

(73) Assignee: ASM Jpapan K.K., Tama (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,147

(22) Filed: Oct. 27, 1998

(30) Foreign Application Priority Data

Oct. 28, 1997 (JP) .............................. 9-311051

(51) Int. Cl.[7] ........................................... C23C 16/509
(52) U.S. Cl. ................................ 118/723 I; 156/345.49
(58) Field of Search ...................... 118/723 E, 723 MP, 118/723 I, 723; 427/569; 428/711

(56) References Cited

U.S. PATENT DOCUMENTS

| | | | | |
|---|---|---|---|---|
| 5,397,962 A | * | 3/1995 | Moslehi | 315/111.51 |
| 5,417,834 A | * | 5/1995 | Latz | 204/192.12 |
| 5,460,707 A | * | 10/1995 | Wellerdieck | 156/345 |
| 5,464,476 A | * | 11/1995 | Gibb et al. | 118/723 MP |
| 5,565,738 A | * | 10/1996 | Samukawa et al. | 315/111.81 |
| 5,591,493 A | * | 1/1997 | Paranjpe et al. | 427/569 |
| 5,669,975 A | * | 9/1997 | Ashtiani | 118/723 I |
| 5,690,050 A | * | 11/1997 | Doi | 118/723 IR |
| 5,846,883 A | * | 12/1998 | Moslehi | 438/711 |
| 5,904,780 A | * | 5/1999 | Tomoyasu | 118/723 E |
| 6,033,481 A | * | 3/2000 | Yokogawa et al. | 118/723 |
| 6,089,182 A | * | 7/2000 | Hama | 118/723 AN |
| 6,093,457 A | * | 7/2000 | Okumura et al. | 427/569 |
| 6,101,970 A | * | 8/2000 | Koshimizu | 118/723 E |
| 6,149,760 A | * | 11/2000 | Hama | 118/723 I |
| 6,155,200 A | * | 12/2000 | Horiike et al. | 118/723 MA |
| 6,273,022 B1 | * | 8/2001 | Pu et al. | 118/723 MA |

FOREIGN PATENT DOCUMENTS

DE  19548657  * 12/1995  ............ H05H/1/30

OTHER PUBLICATIONS

Samukawa et al, "Effect of multicusp magnetic field on electron confinement in a pulse time modulated plasma", Appl.Phys.Lett. 69(22), Nov. 1996.*

* cited by examiner

Primary Examiner—Gregory Mills
Assistant Examiner—Rudy Zervigon
(74) Attorney, Agent, or Firm—Knobbe, Martens, Olson and Bear, LLP

(57) ABSTRACT

There is provided an inductively coupled plasma processing apparatus for generating uniform and stable plasma at a high density. The plasma processing apparatus for semiconductors for processing an object to be processed utilizing plasma comprises an evacuated reaction chamber for processing the object to be processed therein, an antenna formed by a plurality of linear conductors provided in the reaction chamber and an RF power supply connected to one end of the plurality of linear conductors. The antenna is formed by at least three linear conductors disposed such that they radially extend from the center of the antenna at equal intervals from each other, and each of the linear conductors is connected to the ground at one end thereof and is connected to the RF power supply at the other end. An insulating process is provided on the surface of the linear conductors of said antenna. The plasma processing apparatus for semiconductors according to the invention further comprises an electromagnet for generating a magnetic field in a direction orthogonal to an induced electrical field.

8 Claims, 4 Drawing Sheets

(A)

(A')

(B)

(B')

(C)

(C')

(D)

(E)

PLASMA PROCESSING APPARATUS FOR SEMICONDUCTORS

BACKGROUND OF THE INVENTION

1. Field of the Invention

The present invention relates to a plasma processing apparatus for manufacturing semiconductors and, more particularly, to an inductively coupled plasma (ICP) processing apparatus utilizing radio frequencies.

2. Description of the Related Art

Capacitively coupled plasma processing apparatuses utilizing radio frequencies have been widely used as apparatuses for performing a plasma process on semiconductor substrates in a reaction chamber. This process is to generate an electrical field between parallel plate type electrodes by applying radio frequency power to either or both of them to cause plasma discharge, and it has been applied to plasma CVD processes and RIE processes.

However, conventional parallel plate type plasma processing apparatuses have exhibited limited capability in generating high density plasma. Further, demands for ultra-fine processing of semiconductor devices in these days has increased so as to provide uniform plasma with higher density and controlling it with high accuracy.

Thus, ECR (electron-cyclotron resonance) plasma and ICP (inductively coupled plasma) and the like have been conceived as an example exceeding improvements over the conventional parallel plate type capacitively coupled plasma.

Generally, the ECR method is to apply a strong magnetic field to plasma using a magnetic field generating coil and to apply a microwave (at 2.45 GHz in general) in parallel with the magnetic field, thereby increasing the plasma density. Electrons at a cyclotron frequency are accelerated by absorbing wave energy of the microwave that penetrates through the plasma, which increases the frequency of collision between neutral particles and electrons to increase the plasma density. According to this method, however, it is difficult to obtain uniform plasma having a large diameter because it involves a large and complicated apparatus. As an improvement over this method, there is a method wherein power at a radio frequency in a VHF band (from 100 MHz to 1 GHz) is applied to an antenna which is electrically floating (not grounded) to generate an electrical field in parallel with the traveling direction of electrons to accelerate electrons, thereby producing high density plasma. However, this method also has a problem in that the length of such an antenna must be increased when a high frequency such as a radio frequency in a frequency band lower than VHF is used, which results in an increase in apparatus dimensions.

The ICP method is to apply power at a radio frequency (in the range from 100 kHz to 100 MHz) to an antenna in the form of a coil or loop wound around the periphery of a container made of an insulator to induce a high frequency electrical field, thereby accelerating electrons to produce plasma. However, this method has a problem in that a very expensive bell jar made of alumina or quartz having a large diameter is required to process an object having a large diameter, which results in an increase in the cost of the apparatus. As an improvement on this, there is a method wherein an antenna in the form of a loop is provided in a reaction chamber. However, this method also has a problem in that the coil or loop used is difficult to process to provide it with insulating properties because it has a circular configuration. As a result of an insufficient insulating process, arcing or abnormal discharge occurs between the coil or loop and plasma generated to make the plasma unstable and, in addition, the density of the plasma thus generated is limited because high RF power can not be used.

It is therefore an object of the present invention to provide an inductively coupled plasma processing apparatus which generates uniform and stable plasma with high density.

It is another object of the present invention to provide an inductively coupled plasma processing apparatus capable of controlling a spatial profile of plasma with high accuracy.

It is still another object of the present invention to provide an inductively coupled plasma processing apparatus which does not need additional devices and which has a compact body.

SUMMARY OF THE INVENTION

In order to achieve the above-described object, a plasma processing apparatus according to the present invention comprises means as described below.

A plasma processing apparatus for processing an object to be processed utilizing plasma according to the present invention comprises:

an evacuated reaction chamber for processing the object to be processed therein;

an antenna provided in the inside of the reaction chamber formed by a plurality of linear conductors; and an RF power supply connected to one end of the plurality of linear conductors.

Specifically, the antenna is constituted by at least three linear conductors disposed such that they radially extend from the center of the antenna at equal intervals from each other, and each of the linear conductors is grounded at one end thereof and is connected to the RF power supply at the other end thereof.

Alternatively, the antenna may be formed by at least three linear conductors having the same length disposed at the same distance from the center of the antenna.

While the plurality of linear conductors are preferably connected to each other in parallel, they may be connected to each other in series.

Further, the antenna may have a structure formed by two layers which are in parallel with each other.

Preferably, the surface of the plurality of linear conductors of the antenna is insulated.

More preferably, the antenna may have a hollow tubular structure to allow cooling water to flow therethrough.

A plasma processing apparatus for semiconductors according to the present invention further comprises magnetic field generating means for generating a magnetic field in a direction orthogonal to an induced electrical field.

DETAILED DESCRIPTION OF PREFERRED EMBODIMENTS

The present invention will now be described in detail with reference to the drawings.

Figure 1:
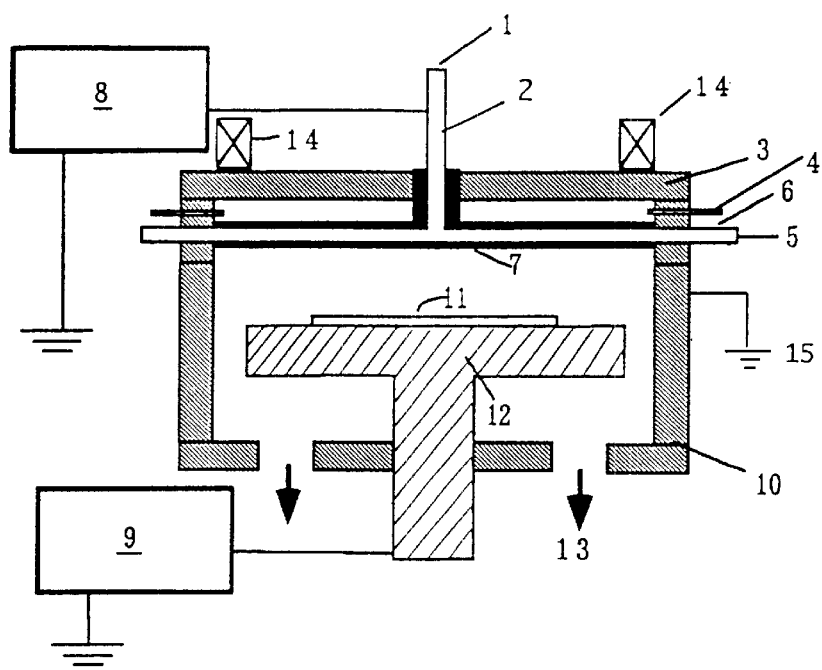
FIG. 1 is a schematic diagram of a plasma processing apparatus according to the present invention.

FIG. 1 is a schematic diagram of a plasma processing apparatus according to the present invention. The plasma processing apparatus comprises a reaction chamber 10, a susceptor 12, an RF power supply 9 connected to the susceptor, an antenna 6 for generating an induced electrical field for generating plasma and an RF power supply 8 connected to one end of the antenna. Preferably, the reaction chamber 10 is a cylindrical container having an inner diameter of 400 mm made of aluminum and has a plurality of (preferably 8 or more) gas inlet 4 and outlet 13 on an outer wall 3 thereof. The outlet 13 are connected to a vacuum evacuator (not shown). A semiconductor substrate to be processed is placed on the susceptor 12 and is biased by the RF power supply 9 connected to the susceptor. The antenna 6 is formed by a plurality of linear conductors to be detailed later which are coupled such that they radially extend from the center of the antenna at equal intervals from each other. The center of the antenna is located on the central axis of the reaction chamber. The antenna 6 is preferably a hollow tubular element made of stainless steel in which cooling water can flow through inlet 1 and outlet 5. Preferably, the surface of the antenna 6 is coated or covered with an insulator 7 made of aluminum oxide ($Al_2O_3$) having a thickness of 2 mm to ensure complete insulation from plasma. The RF power supply 8 is connected to an extension 2 which extends vertically on the center of the antenna 6. An end of each of the linear conductors of the antenna 6 is secured to the outer wall 3 of the reaction chamber made of aluminum in electrical conduction thereto, and the outer wall 3 is connected to ground 15. Thus, each of the conductors of the antenna 6 is connected in parallel with the RF power supply 8. While the frequency of the RF power supply is preferably 13.56 MHz, power at a high frequency in the band from 100 kHz to 100 MHz may be used instead. An electromagnet 14 is provided at an upper part of the reaction chamber. Although the electromagnet 14 is preferably an electromagnetic coil, it maybe a permanent magnet. As described below, the electromagnet 14 provides magnetic lines of flux running downward or upward in FIG. 1.

Figure 2:
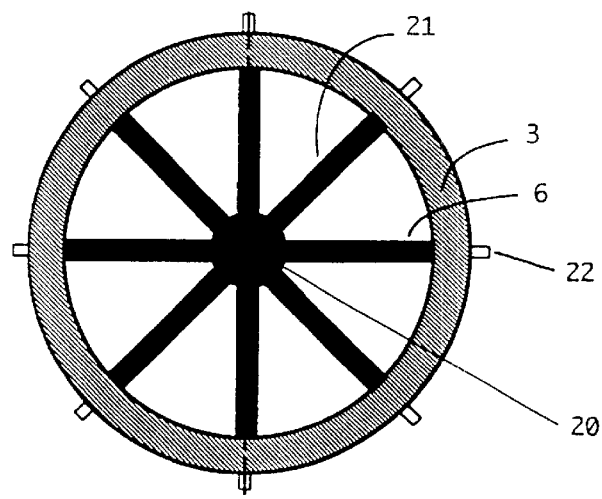
FIG. 2 is a plan view of an antenna according to a preferred embodiment of the present invention.

FIG. 2 is an enlarged view of the preferred embodiment of an antenna according to the invention shown in FIG. 1. The antenna 6 is formed by eight linear conductors 21 which are coupled to each other at the center 20 of the antenna at one end thereof and are radially disposed at equal intervals from each other. In this case, the conductors 21 are disposed at an angle of 45° in axial symmetry. The antenna 6 includes an extension 2 vertically extending from the center 20 thereof to be connected to the external RF power supply 8. The other end 22 of each linear conductor 21 of the antenna 6 is electrically conductive to the outer wall 3 of the reaction chamber 10 and is connected to the ground 15 through the outer wall 3. Thus, the conductors 21 are preferably connected in parallel to the RF power supply 8. Preferably, the antenna 6 is insulated by coating utilizing aluminum oxide only where located inside the reaction chamber and is sealed with normal sealing means at connection portion to the reaction chamber. The thickness of the coating is preferably 2 mm, but it may be thicker. The insulation may be provided using materials rather than aluminum oxide. As described above, each of the conductors of the antenna 6 is a hollow tubular element through which cooling water can be circulated. While the antenna 6 is preferably made of stainless steel, other conductive metals may be used. While the outer diameter of each conductor of the antenna 6 is preferably 10 mm, a larger or smaller diameter may be employed.

Figure 3A:
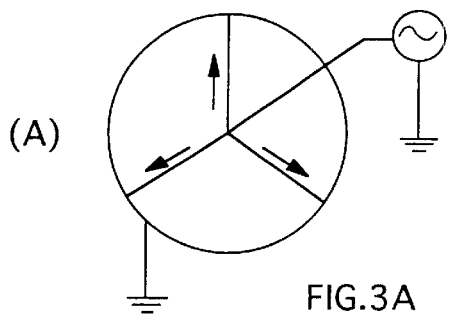
FIGS. 3A, 3B, 3C, 3D, 3E, 3F, 3G and 3H illustrate other embodiments of an antenna according to the present invention.
Figure 3E:
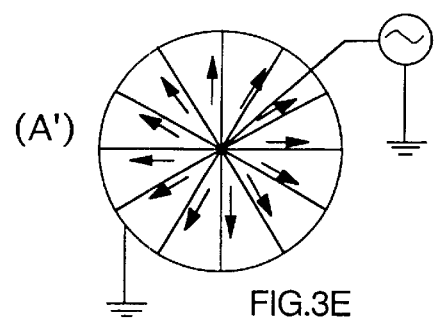
Figure 3B:
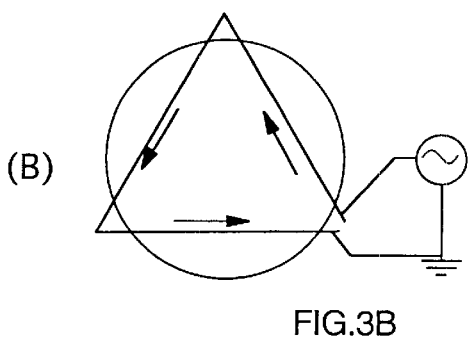
Figure 3F:
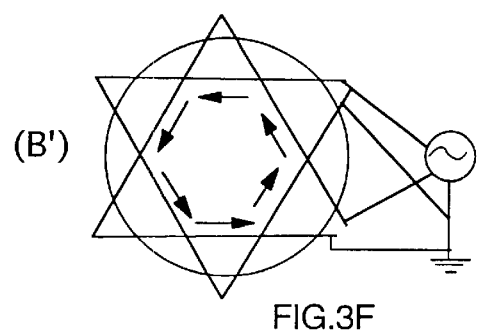
Figure 3C:
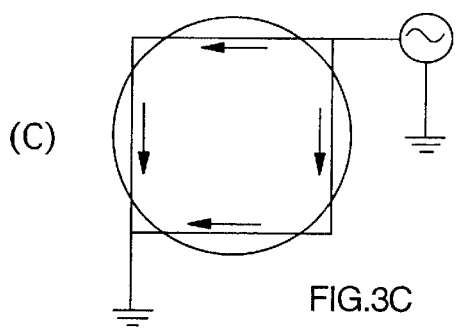
Figure 3G:
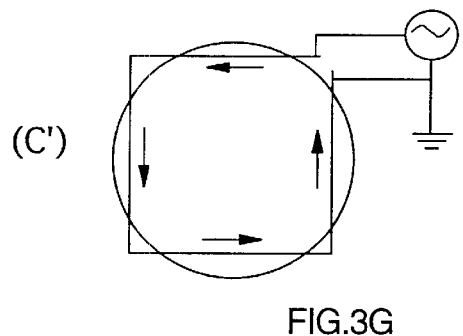
Figure 3D:
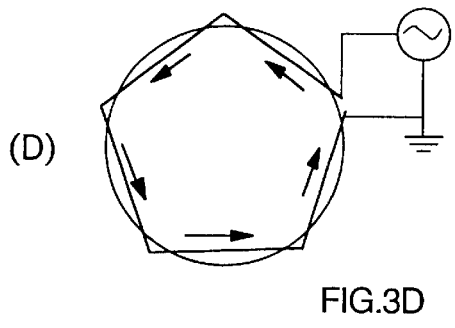
Figure 3H:
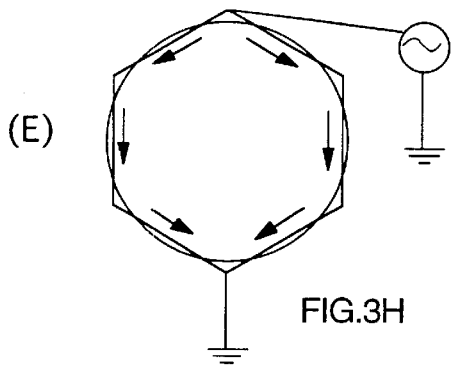

FIGS. 3A, 3B, 3C, 3D, 3E, 3F, 3G and 3H show other embodiments of the antenna according to the present invention. FIG. 3A shows an embodiment of a parallel antenna which is configured by reducing the number of conductors to three in the embodiment shown in FIG. 2. FIG. 3F shows an embodiment of a parallel antenna which is configured by increasing the number of conductors to twelve. Any other number of conductors may be selected. FIGS. 3B, 3G, 3C, 3H, 3D and 3E show embodiments of antennas formed by a plurality of linear conductors having the same length disposed at the same distance from the center of the antenna. FIG. 3B shows an embodiment of a series antenna in the form of an equilateral triangle. FIG. 3G shows an embodiment of a two-layer antenna formed by stacking antennas according to the embodiment shown in FIG. 3B. In this case, the antennas in those layers are connected in parallel with each other. FIG. 3C shows an embodiment of a square parallel antenna, and FIG. 3H shows another embodiment of a square series antenna. FIG. 3D shows an embodiment of a pentagonal series antenna. FIG. 3E shows an embodiment of a hexagonal parallel antenna. Other polygonal antennas may be configured. Further, each of such antennas may have a multi-layer configuration. In radial type antennas, conductors may be provided at an inclination of a predetermined angle from the horizontal and it is not necessary that they are present on the same plane. Furthermore, antennas may be arbitrarily connected to each other in parallel or in series. The linear conductors shown in each of FIGS. 3A through 3E are insulated by coating only in the region located inside the reaction chamber (i.e., the region in contact with plasma). Therefore, no insulation is provided in the region where the linear conductors are coupled to each other as shown in FIGS. 3B through 3E. Thereby, complete insulation is achieved such that plasma is stabilized.

A description will now be made on the operation of a plasma processing apparatus according to the invention having a configuration as described above. When a high frequency current is applied from the RF power supply 8 to the antenna 6, a high frequency magnetic field is excited in the reaction chamber 10 to induce a high frequency electrical field. A very small amount of electrons in the reaction chamber are accelerated by this electrical field and collide with a molecule of a processing gas taken into the reaction chamber. As a result, electrons are bombarded out to ionize the gas molecules. The electrons thus generated acquire energy in the high frequency electrical field to collide with the next molecule to ionize it. Such electronic ionization process is repeated to generate plasma in the reaction chamber. Since the semiconductor wafer is biased by the other RF power supply 9, ions in the plasma are accelerated toward the wafer to perform a desired process on the wafer. A film formation process or etching process can be performed by selecting the type of the processing gas appropriately.

In the preferred embodiment of the invention, since the antenna has a radial configuration, the induced electrical field is also formed such that it radially extends from the center of the reaction chamber. The plasma generated in the reaction chamber diffuses and disappears when it reaches the inner wall thereof. Therefore, the plasma density in the vicinity of the inner wall is lower than that in the center of the reaction chamber, which results in a density gradient from the center of the reaction chamber to the periphery thereof. Such a density gradient promotes the diffusion of plasma in the same direction, which consequently results in a loss of the plasma as a whole. In order to prevent such diffusion of plasma, an external magnetic field is applied by the electromagnet 14 in a direction orthogonal to the high frequency electrical field (downward or upward in FIG. 1). This causes the diffusion ions and electrons to move under the influence of a force in the direction along the inner wall of the reaction chamber. As a result, the diffusion from the center of the reaction chamber to the periphery is suppressed.

Figure 4A:
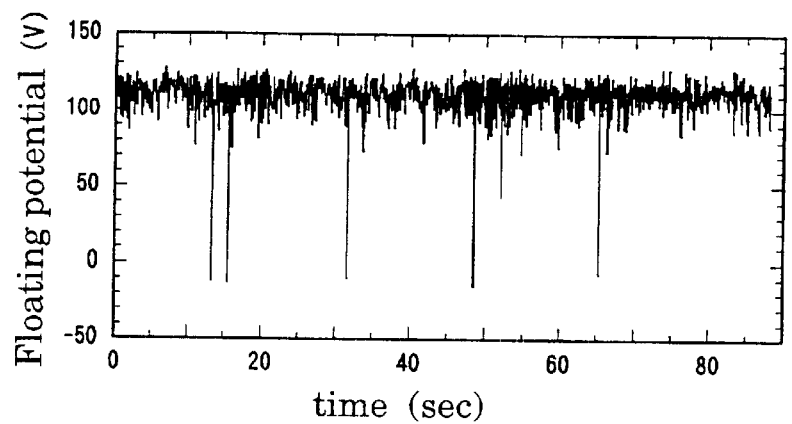
FIGS. 4A and 4B are graphs showing the stability of plasma achieved by the use of conventional antennas.
Figure 4B:
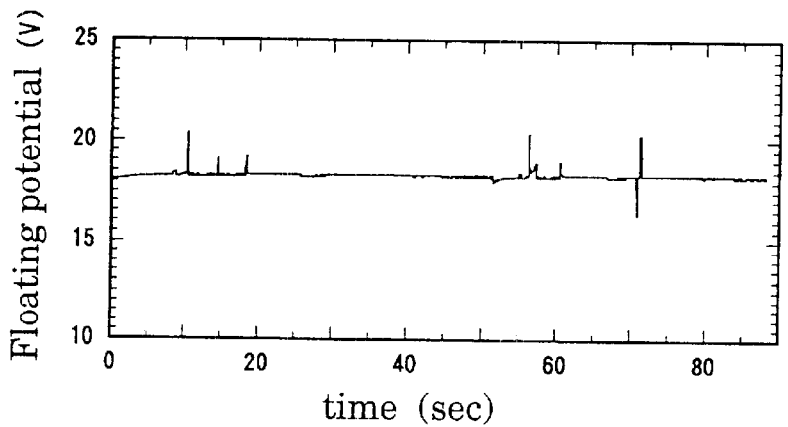
Figure 4C:
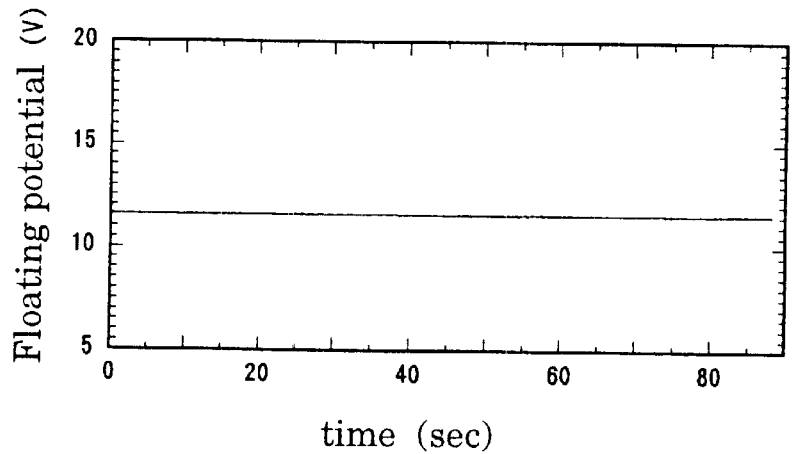
FIG. 4C shows the stability of plasma achieved by the use of an antenna according to a preferred embodiment of the present invention.

A description will now be made on an experiment to evaluate the plasma processing apparatus of the present invention. FIGS. 4A, 4B and 4C show the results of an experiment to compare conventional loop antennas and the linear radial antenna according to the embodiment of the invention in terms of the stability of plasma generated by them. The experiment was conducted by measuring floating potentials over time under a reaction chamber internal pressure of 5 mTorr and using high frequency power of 500 W (at a frequency of 13.56 MHz) and Ar as the processing gas. FIG. 4A shows a case of the antenna, shown in page 2189, Vol.33(1994) Japan Journal of Applied Physics, in the form of a circular loop which is formed by one turn of a stainless steel tube having a diameter of 250 mm without insuration coating. FIG. 4B shows a case wherein an insulating coating having a thickness of 5 mm is provided on the loop antenna in FIG. 4A. FIG. 4C shows a case wherein the antenna 6 according to the preferable embodiment is used. FIG. 4A indicates that the uninsulated loop antenna has an average floating potential very much higher than those of the other two antennas. Consequently, this causes frequent arcing in plasma, resulting in an unstable electric potential. FIG. 4B indicates that the loop antenna having an insulating coating on the surface still has dispersion of potential in some locations, although the floating potential is has been reduced. This is attributable to incomplete insulation between the metal antenna and the plasma. However, it is very difficult to coat an antenna in the form of a circular loop with an insulator uniformly without any gap, which not only requires high accuracy in material processing from the technical point of view but also involves a serious increase in manufacturing costs to achieve. It is therefore difficult to improve the stability of the conventional loop antennas further. On the contrary, FIG. 4C showing the use of the linear radial antenna according to the invention indicates that it has an average float potential which is lower and much stabler than those of the other two antennas. Although the magnetic field for suppressing diffusion originating from the electromagnet 14 was not applied in the illustrated case, the same stability was exhibited when it was applied.

The results of the experiment show that forming an antenna in a linear configuration allows a simpler and more economical process to provide an insulating coating on the surface of the antenna and allows complete insulation between the antenna and plasma to improve the stability of plasma significantly.

Figure 5:
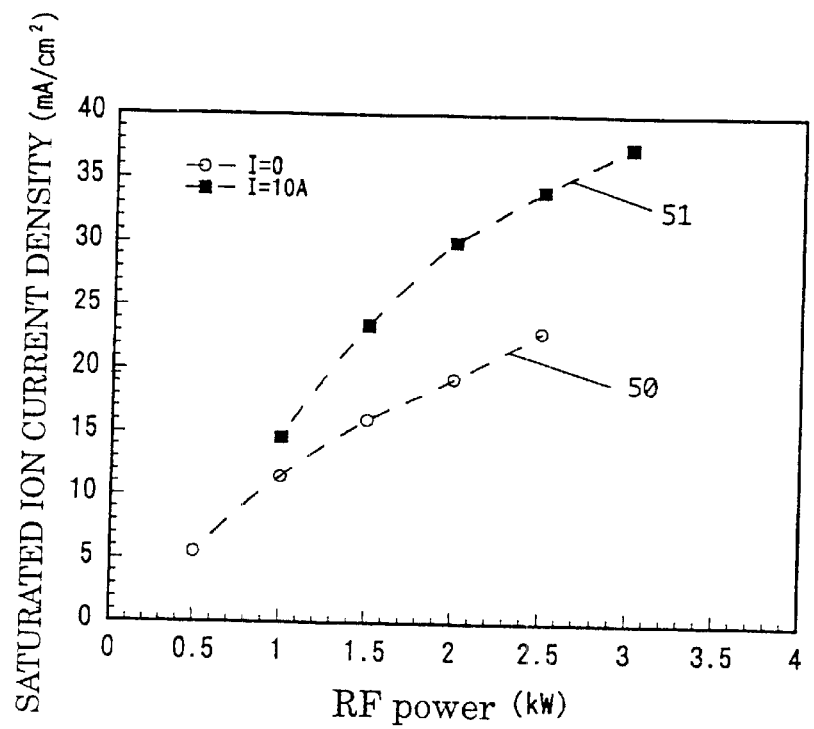
FIG. 5 is a graph showing the relationship between plasma density and RF power for an antenna according to a preferred embodiment of the present invention.

FIG. 5 shows results of an experiment to measure the relationship between the current density of saturated ions and applied RF power in the center of the reaction chamber of the preferred embodiment of the plasma processing apparatus according to the present invention. The saturated ion current density substantially corresponds to the plasma density. The experiment was conducted by varying the applied RF power under a reaction chamber internal pressure of 5 mTorr at an RF frequency of 13.56 MHz using Ar as the processing gas. The graph 50 shows a case wherein no magnetic field from magnetic field generating means is applied, and the graph 51 shows a case wherein a current of 10 A is applied to the electromagnet coil 14 to apply a magnetic field. The graph 50 indicates that the saturated ion current density monotonously increases as the applied RF power is increased to allow the plasma density to be easily improved. For example, the plasma density achieved by applying RF power of 2.5 kW is about four times higher than the plasma density achieved by applying RF power of 0.5 kW. This is attributable to the fact that high power can be applied to the linear radial antenna of the invention because of its complete insulation and that such high power can be efficiently applied because a plurality of conductors are parallel-connected to reduce the amplitude of a high frequency voltage. Further, the graph 51 indicates that the application of an external magnetic field improves the plasma density further even if the RF power is kept constant. For example, when the applied RF power is 2 kW, the application of an external magnetic field improves the plasma density by a factor of about 1.5. This is attributable to the fact that the diffusion of plasma ions is suppressed to prevent loss, resulting in further improvement of the plasma density.

The experimental results indicated that forming an antenna in a linear configuration allows high RF power to be applied, thereby allowing plasma density to be easily improved. Further, it was revealed that the application of an external magnetic field makes it possible to improve plasma density further without varying the applied RF power.

Figure 6:
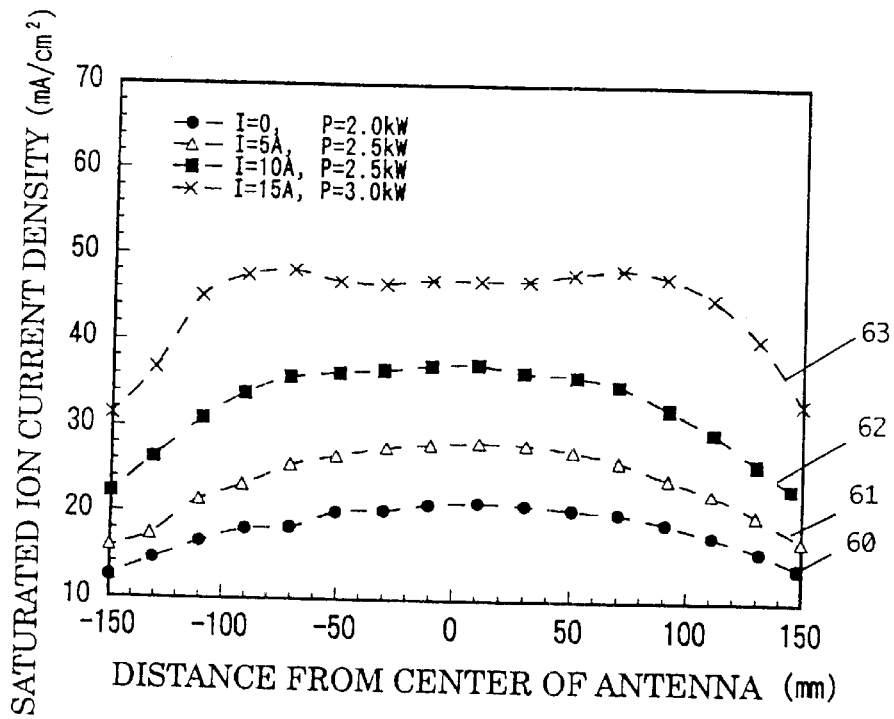
FIG. 6 illustrates spatial profiles of plasma generated by an antenna according to a preferred embodiment of the present invention.

FIG. 6 shows results of an experiment to measure the relationship between the saturated ion current density in the reaction chamber and the distance from the center of the reaction chamber in the preferable embodiment of the plasma processing apparatus according to the invention. The saturated ion current density substantially corresponds to the plasma density here again. The experimental results show spatial profiles of plasma in the reaction chamber. The experiment was conducted with a reaction chamber internal diameter of 400 mm, a reaction chamber internal pressure of 5 mTorr and an RF frequency of 13.56 MHz using Ar as the processing gas by varying the applied RF power and the strength of the external magnetic field. The graph 60 shows a profile of plasma obtained at RF power of 2.0 kW and an electromagnet current of 0 A. The graph 61 shows a profile of plasma obtained at RF power of 2.5 kW and an electromagnet current of 5 A. The graph 62 shows a profile of plasma obtained at RF power of 2.5 kW and an electromagnet current of 10 A. The graph 63 shows a profile of plasma obtained at RF power of 3.0 kW and an electromagnet current of 15 A. Those graphs indicate that the plasma density is substantially uniform in the range up to a radius of about 100 mm and that the uniformity is further improved by increasing the electromagnet current. Such high uniformity and controllability is attributable to the fact that the conductors of the antenna according to the invention are radially disposed around the center thereof at equal intervals of a constant angle and fact that the external magnetic field makes it possible to suppress diffusion of ions and electrons.

The experimental results indicated that plasma generated by the linear antenna according to the invention has very high spatial uniformity and controllability. It was also revealed that the use of such uniformity and controllability of plasma in a reaction chamber having a greater inner diameter allows a semiconductor wafer having a larger diameter to be easily processed.

A linear antenna according to the present invention can be subjected to an insulating coating process on the surface thereof easily and economically, which allows complete insulation between the antenna and plasma to improve the stability of plasma significantly.

A linear antenna according to the present invention makes it possible to apply a radio frequency of high power to improve plasma density easily. Further, the application of an external magnetic field makes it possible to improve plasma density further without varying the applied RF power.

Furthermore, a linear antenna according to the present invention significantly improves the spatial uniformity and controllability of plasma generated thereby. The use of such uniformity and controllability of plasma in a reaction chamber having a greater inner diameter allows a semiconductor wafer having a larger diameter to be easily processed.

Moreover, a linear antenna according to the invention makes it possible to provide a compact and economical plasma processing apparatus having small dimensions.

Having described and illustrated the principles of the invention in preferred embodiments thereof, it is apparent to those skilled in the art that the invention can be modified in arrangement and detail without departing from such principles. It is therefore intended to claim all modifications and variation coming within the spirit and scope of the invention as set forth in the following claims.

What is claimed is:

1. An inductive coupled plasma (ICP) processing apparatus comprising:

a reaction chamber for processing an object's surface with plasma, said reaction chamber having a gas inlet and a gas outlet and being pressure-controllable;

a susceptor for placing the object thereon, said susceptor being provided in an interior of the reaction chamber and being adapted to be connected to an RF power supply;

an antenna constituted by a plurality of insulation-covered linear conductors provided in the interior of the reaction chamber where the antenna faces the object when placed on the susceptor, said antenna disposed in a plane substantially parallel to the object's surface and having a central axis substantially perpendicular to the object's surface, said antenna being adapted to be connected to an RF power supply, said antenna being grounded, said linear conductors being arranged in rotational symmetry with respect to the central axis, wherein the insulation-covered linear conductors are exposed to plasma in the interior of the reaction chamber when being operated, and an electromagnet having a central axis and disposed substantially on top of the reaction chamber in the vicinity of and above the plane of the antenna where the central axis of the electromagnet is aligned with the central axis of the antenna and substantially perpendicular to the plane of the antenna, and where the electromagnet generates a magnetic field in a direction along the central axis of the electromagnet or the antenna.

2. The plasma-processing apparatus according to claim 1, wherein the antenna is constituted by at least three linear conductors, each radially extending from the central axis.

3. The plasma-processing apparatus according to claim 1, wherein the antenna has two terminals, one terminal being adapted to be connected to the RF power supply, the other terminal being adapted to be connected to the ground.

4. The plasma-processing apparatus according to claim 1, wherein the linear conductors each are electrically connected in a line.

5. The plasma processing apparatus according to claim 1, wherein the linear conductors each are electrically connected in series.

6. The plasma-processing apparatus according to claim 1, wherein the linear conductors are disposed in two layers parallel to each other with respect to the susceptor.

7. The plasma-processing apparatus according to claim 1, wherein linear conductors have a hollow tubular structure.

8. The plasma-processing apparatus according to claim 7, wherein the linear conductors are adapted to be connected to a cooling-water supply, and the hollow tubular structure is used for passing cooling water therethrough.

* * * * *